_US009263285B2_

(12) United States Patent
Shinjo et al.

(10) Patent No.: US 9,263,285 B2
(45) Date of Patent: Feb. 16, 2016

(54) COMPOSITION FOR FORMING A RESIST UNDERLAYER FILM INCLUDING HYDROXYL GROUP-CONTAINING CARBAZOLE NOVOLAC RESIN

(75) Inventors: Tetsuya Shinjo, Toyama (JP); Hiroaki Okuyama, Toyama (JP); Keisuke Hashimoto, Toyama (JP); Yasunobu Someya, Toyama (JP); Ryo Karasawa, Toyama (JP); Masakazu Kato, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/992,864

(22) PCT Filed: Dec. 5, 2011

(86) PCT No.: PCT/JP2011/078088
§ 371 (c)(1),
(2), (4) Date: Jun. 10, 2013

(87) PCT Pub. No.: WO2012/077640
PCT Pub. Date: Jun. 14, 2012

(65) Prior Publication Data
US 2013/0280913 A1    Oct. 24, 2013

(30) Foreign Application Priority Data

Dec. 9, 2010    (JP) .................................. 2010-275020

(51) Int. Cl.
| H01L 21/302 | (2006.01) |
| H01L 21/308 | (2006.01) |
| C09D 139/04 | (2006.01) |
| H01L 21/027 | (2006.01) |
| G03F 7/09 | (2006.01) |
| G03F 7/004 | (2006.01) |

(52) U.S. Cl.
CPC .......... *H01L 21/3081* (2013.01); *C09D 139/04* (2013.01); *G03F 7/091* (2013.01); *G03F 7/094* (2013.01); *H01L 21/0271* (2013.01); *G03F 7/0045* (2013.01)

(58) Field of Classification Search
CPC ........ C09K 8/24; C09K 8/035; G03F 7/0045; G03F 7/004; G03F 7/0046; G03F 7/091; G03F 7/094; G09K 8/24; H01L 21/31144; H01L 21/3081; H01L 21/0271
USPC ........... 252/79.1, 79.2, 79.3, 79.4; 430/271.1, 430/313, 318, 316; 438/708, 717, 725, 736
See application file for complete search history.

(56) References Cited

U.S. PATENT DOCUMENTS

| 4,200,556 | A | 4/1980 | Robinson et al. |
| 7,378,217 | B2 | 5/2008 | Oh et al. |
| 7,632,626 | B2 * | 12/2009 | Sakamoto ..................... 430/311 |
| 8,450,048 | B2 * | 5/2013 | Hatakeyama et al. ........ 430/313 |
| 2009/0098486 | A1 | 4/2009 | Yoshimura et al. |
| 2010/0151382 | A1 * | 6/2010 | Hatakeyama .............. 430/270.1 |

FOREIGN PATENT DOCUMENTS

| JP | A-H01-154050 | 6/1989 |
| JP | A-H02-22657 | 1/1990 |
| JP | A-H02-293850 | 12/1990 |
| JP | A-5-140275 | 6/1993 |

(Continued)

OTHER PUBLICATIONS

Extended European Search Report issued in European Patent Application No. 11846547.5 on Jun. 17, 2014.

(Continued)

*Primary Examiner* — Lan Vinh
(74) *Attorney, Agent, or Firm* — Oliff PLC

(57) ABSTRACT

There is provided a composition for forming a resist underlayer film having heat resistance for use in a lithography process in semiconductor device production. A composition for forming a resist underlayer film, comprising a polymer that contains a unit structure of formula (1) and a unit structure of formula (2) in a proportion of 3 to 97:97 to 3 in molar ratio:

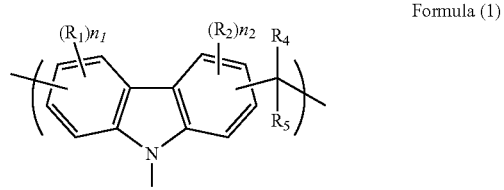

Formula (1)

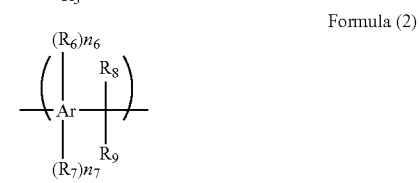

Formula (2)

A method for producing a semiconductor device, including the steps of: forming an underlayer film using the composition for forming a resist underlayer film on a semiconductor substrate; forming a hard mask on the underlayer film; further forming a resist film on the hard mask; forming a patterned resist film and developing; etching the hard mask according to the patterned resist film; etching the underlayer film according to the patterned hard mask; and processing the semiconductor substrate according to the patterned underlayer film.

10 Claims, No Drawings

(56) References Cited

FOREIGN PATENT DOCUMENTS

| JP | A-2002-241455 | 8/2002 |
| JP | A-2005-128509 | 5/2005 |
| JP | A-2007-178974 | 7/2007 |
| JP | A-2007-199653 | 8/2007 |
| JP | A-2007-297540 | 11/2007 |
| JP | A-2010-117629 | 5/2010 |
| WO | WO 2007/105776 A1 | 9/2007 |
| WO | WO 2009/119201 A1 | 10/2009 |
| WO | WO 2010/147155 A1 | 12/2010 |
| WO | WO 2011/034062 A1 | 3/2011 |

OTHER PUBLICATIONS

Office Action dated Sep. 17, 2014 in Chinese Patent Application No. 201180057083.2.
Jun. 12, 2013 International Preliminary Report on Patentability issued in International Application No. PCT/JP2011/078088.
Dec. 27, 2011 International Search Report issued in International Application No. PCT/JP2011/078088.

* cited by examiner

COMPOSITION FOR FORMING A RESIST UNDERLAYER FILM INCLUDING HYDROXYL GROUP-CONTAINING CARBAZOLE NOVOLAC RESIN

TECHNICAL FIELD

The present invention relates to a composition for forming a resist underlayer film for lithography that is useful in semiconductor substrate processing, to a resist pattern formation method that utilizes the composition for forming a resist underlayer film, and to a method for producing a semiconductor device.

BACKGROUND ART

Microfabrication by lithography in which photoresist compositions are used is a technology conventionally resorted to in semiconductor device production. The abovementioned microfabrication is a processing method that involves forming a thin film of a photoresist composition on a substrate to be processed, for instance a silicon wafer, irradiating actinic rays, such as ultraviolet rays, onto the thin film of the photoresist composition via a mask pattern in which there is drawn a pattern of the semiconductor device, developing the pattern, and etching the substrate to be processed, such as a silicon wafer, using the obtained photoresist pattern as a protective film. Ever higher integration in semiconductor devices in recent years has been matched by a trend towards shorter wavelengths in the actinic rays that are utilized, from KrF excimer lasers (248 nm) to ArF excimer lasers (193 nm). This shift to shorter wavelengths has been accompanied by significant problems, namely standing waves and diffuse reflection of the actinic rays off the substrate. Accordingly, methods have been extensively studied that involve providing an anti-reflective coating (Bottom Anti-Reflective Coating, BARC) between the photoresist and the substrate to be processed.

Thinner resists have become desirable as a response to the problems of resolution and resist pattern collapse after development that arise as resist patterns become ever thinner. Accordingly, achieving sufficient resist pattern thickness for substrate processing was difficult, and thus processes have become necessary in which the function of a mask during substrate processing is imparted not only to the resist pattern, but also to a resist underlayer film that is produced between the resist and the semiconductor substrate to be processed. Such resist underlayer films for processing that are now required include resist underlayer films for lithography having a selection ratio of dry etching rate close to that of the resist, resist underlayer films for lithography having a selection ratio of dry etching rate smaller than that of the resist, and resist underlayer films for lithography having a selection ratio of dry etching rate smaller than that of the semiconductor substrate, which are different from conventional resist underlayer films having high etch rate (high etching rate).

Examples of polymers for the abovementioned resist underlayer films include, for instance, the following.

Compositions for forming a resist underlayer film that utilize polyvinyl carbazole (Patent Document 1, Patent Document 2 and Patent Document 3).

Compositions for forming a resist underlayer film that utilize a fluorene phenol novolac resin (for instance, Patent Document 4).

Compositions for forming a resist underlayer film that utilize a fluorene naphthol novolac resin (for instance, Patent Document 5).

Compositions for forming a resist underlayer film that include a resin having repeating units of fluorene phenol and an arylalkylene (for instance, Patent Document 6 and Patent Document 7).

PRIOR ART DOCUMENTS

Patent Documents

Patent Document 1: Japanese Patent Application Publication No. 2-293850 (JP 2-293850 A)
Patent Document 2: Japanese Patent Application Publication No. 1-154050 (JP 1-154050 A)
Patent Document 3: Japanese Patent Application Publication No. 2-22657 (JP 2-22657 A)
Patent Document 4: Japanese Patent Application Publication No. 2005-128509 (JP 2005-128509 A)
Patent Document 5: Japanese Patent Application Publication No. 2007-199653 (JP 2007-199653 A)
Patent Document 6: Japanese Patent Application Publication No. 2007-178974 (JP 2007-178974 A)
Patent Document 7: U.S. Pat. No. 7,378,217

SUMMARY OF THE INVENTION

Problems to be Solved by the Invention

It is an object of the present invention to provide a composition for forming a resist underlayer film for use in a lithography process in semiconductor device production. It is also an object of the present invention to provide a resist underlayer film for lithography having a selection ratio of dry etching rate close to that of a resist, a resist underlayer film for lithography having a selection ratio of dry etching rate smaller than that of a resist, or a resist underlayer film for lithography having a selection ratio of dry etching rate smaller than that of a semiconductor substrate, and in which an excellent resist pattern can be achieved without occurrence of intermixing with a resist layer. The present invention allows imparting the ability of effectively absorbing reflected light from a substrate when using irradiation light having a wavelength of 248 nm, 193 nm, 157 nm or the like in microfabrication. A further object of the present invention is to provide a method for forming a resist pattern, wherein the method utilizes the composition for forming a resist underlayer film. It is likewise an object of the present invention to provide a composition for forming a resist underlayer film for forming a resist underlayer film having also heat resistance.

Means for Solving the Problems

The present invention provides, as a first aspect, a composition for forming a resist underlayer film including a polymer that contains a unit structure of formula (1) and a unit structure of formula (2) such that proportion of the unit structure of formula (1) to the unit structure of formula (2) is 3 to 97:97 to 3 in molar ratio:

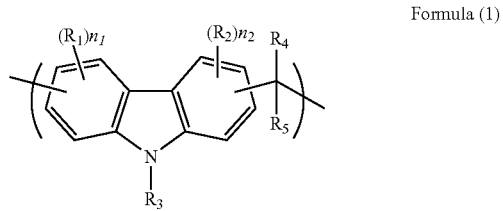

Formula (1)

(in formula (1), $R_1$ and $R_2$ are each independently a hydrogen atom, a halogen atom, a nitro group, an amino group, a hydroxy group, a $C_{1-10}$ alkyl group, a $C_{2-10}$ alkenyl group, a $C_{6-40}$ aryl group, or a combination of the foregoing groups optionally including an ether linkage, a ketone linkage, or an ester linkage; $R_3$ is a hydrogen atom, a $C_{1-10}$ alkyl group, a $C_{2-10}$ alkenyl group, a $C_{6-40}$ aryl group, or a combination of the foregoing groups optionally including an ether linkage, a ketone linkage, or an ester linkage; $R_4$ is a hydrogen atom, or a $C_{6-40}$ aryl group or heterocyclic group optionally substituted with a halogen atom, a nitro group, an amino group or a hydroxy group; $R_5$ is a hydrogen atom, or a $C_{1-10}$ alkyl group, a $C_{6-40}$ aryl group or a heterocyclic group optionally substituted with a halogen atom, a nitro group, an amino group or a hydroxy group; $R_4$ and $R_5$ may form a ring with each other; and n1 and n2 are each an integer from 1 to 3);

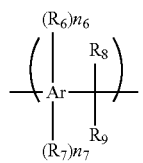

Formula (2)

(in formula (2), Ar is a $C_{6-20}$ aromatic ring group; $R_6$ is a hydroxy group; $R_7$ is a hydrogen atom, a halogen atom, a nitro group, an amino group, a $C_{1-10}$ alkyl group, a $C_{2-40}$ alkenyl group, a $C_{6-40}$ aryl group, or a combination of the foregoing groups optionally including an ether linkage, a ketone linkage or an ester linkage; $R_8$ is a hydrogen atom, or a $C_{6-40}$ aryl group or heterocyclic group optionally substituted with a halogen atom, a nitro group, an amino group or a hydroxy group; $R_9$ is a hydrogen atom, or a $C_{1-10}$ alkyl group, a $C_{6-40}$ aryl group or a heterocyclic group optionally substituted with a halogen atom, a nitro group, an amino group or a hydroxy group; $R_8$ and $R_9$ may form a ring with each other; n6 is an integer from 1 to p, and n7 is an integer p-n6, where p is the maximum number of substituents with which the aromatic ring group Ar can be substituted);

as a second aspect, the composition for forming a resist underlayer film according to the first aspect, wherein in formula (1), $R_1$, $R_2$, $R_3$, and $R_5$ are hydrogen atoms, and $R_4$ is a naphthalene ring or pyrene ring;

as a third aspect, the composition for forming a resist underlayer film according to the first aspect or the second aspect, wherein in formula (2), Ar is a naphthalene ring, $R_7$ and $R_9$ are hydrogen atoms, and $R_8$ is a naphthalene ring or pyrene ring;

as a fourth aspect, the composition for forming a resist underlayer film according to any one of the first aspect to the third aspect, further including a cross-linking agent;

as a fifth aspect, the composition for forming a resist underlayer film according to any one of the first aspect to the fourth aspect, further including an acid and/or an acid generator;

as a sixth aspect, a resist underlayer film, obtained by applying the composition for forming a resist underlayer film according to any one of the first aspect to the fifth aspect onto a semiconductor substrate, and then baking the composition;

as a seventh aspect, a method for forming a resist pattern that is used in semiconductor production, the method including a step of forming an underlayer film by applying the composition for forming a resist underlayer film according to any one of the first aspect to the fifth aspect onto a semiconductor substrate, and then baking the composition;

as an eighth aspect, a method for producing a semiconductor device, the method including the steps of: forming an underlayer film using the composition for forming a resist underlayer film according to any one the first aspect to the fifth aspect on a semiconductor substrate; forming a resist film on the underlayer film; forming a patterned resist film by irradiation of light or electron beams and developing; etching the underlayer film according to the patterned resist film; and processing the semiconductor substrate according to the patterned underlayer film;

as a ninth aspect, a method for producing a semiconductor device, the method including the steps of: forming an underlayer film using the composition for forming a resist underlayer film according to any one the first aspect to the fifth aspect on a semiconductor substrate; forming a hard mask on the underlayer film; further forming a resist film on the hard mask; forming a patterned resist film by irradiation of light or electron beams and developing; etching the hard mask according to the patterned resist film; etching the underlayer film according to the patterned hard mask; and processing the semiconductor substrate according to the patterned underlayer film; and as a tenth aspect, the production method according to the ninth aspect, wherein the hard mask is formed by vapor deposition of an inorganic material.

Effect of the Invention

The composition for forming a resist underlayer film of the present invention allows forming a good shape in a resist pattern without occurrence of intermixing between a top layer section of the resist underlayer film and a layer that covers that top layer section.

The resist underlayer film obtained from the composition for forming a resist underlayer film of the present invention can be imparted with a property of efficiently suppressing reflection from a substrate, while also having the effect of an anti-reflective coating of exposure light.

The composition for forming a resist underlayer film of the present invention allows providing a superior resist underlayer film having a selection ratio of dry etching rate close to that of a resist, or a selection ratio of dry etching rate smaller than that of a resist, or a selection ratio of dry etching rate smaller than that of a semiconductor substrate.

The composition for forming a resist underlayer film of the present invention utilizes a polymer that has a carbazole novolac-based unit structure. Accordingly, the resist underlayer film obtained from the composition has very high heat resistance.

The method for forming a resist pattern of the present invention makes it possible to form, with good precision, a resist pattern of good shape by using, as a resist underlayer film, a film obtained from the abovementioned composition.

MODES FOR CARRYING OUT THE INVENTION

As resist patterns become ever finer, resists are in turn made thinner in order to prevent collapse of the resist pattern after development. There are processes for such thin-film resists wherein a resist pattern is transferred to an underlayer film thereof, in an etching process, and then substrate processing is performed using the underlayer film as a mask, and also processes that involve repeating an operation wherein a resist pattern is transferred to an underlayer film thereof, in an etching process, whereupon the pattern transferred to the underlayer film is further transferred to an underlayer film of the latter, using a different gas composition, and substrate processing is lastly performed. The resist underlayer film of the present invention and the composition for forming the resist underlayer film are effective in such processes, and afford sufficient etching resistance for the processed substrate (for instance, a thermal silicon oxide film, a silicon nitride film, or a polysilicon film on the substrate) when the substrate is processed using the resist underlayer film of the present invention.

The resist underlayer film of the present invention can be used as a planarizing film, a resist underlayer film, an anti-fouling film for resist layers, or a film having dry etching selectivity. Resist patterns can thus be formed easily and with good precision in lithography processes in semiconductor production.

A process may involve forming a resist underlayer film using the composition for forming a resist underlayer film of the present invention, on a substrate; forming a hard mask on the resist underlayer film; forming a resist film on the hard mask; forming a resist pattern by exposure and development; transferring the resist pattern to the hard mask; transferring, to the resist underlayer film, the resist pattern that has been transferred to the hard mask; and processing the semiconductor substrate using that resist underlayer film. The hard mask in this process may be formed out of a coating-type composition that includes an organic polymer and/or inorganic polymer and a solvent, or may be formed by vacuum vapor deposition of an inorganic material. The inorganic material (for instance, silicon oxynitride) forms a deposit on the surface of the resist underlayer film upon vacuum vapor deposition, during which the temperature of the resist underlayer film surface rises to about 400° C. The resist underlayer film from the composition for forming a resist underlayer film of the present invention has very high heat resistance, and hence does not readily undergo thermal degradation even through deposition of such deposits.

The present invention is a composition for forming a resist underlayer film that includes a polymer having a unit structure of formula (1) and a unit structure of formula (2), such that the proportion of the unit structure of formula (1) to the unit structure of formula (2) is 3 to 97:97 to 3, or 10 to 90:90 to 10, in molar ratio.

In the present invention, the abovementioned composition for forming a resist underlayer film for lithography includes the abovementioned polymer and a solvent. The composition can contain a cross-linking agent and an acid; and can contain, as the case may require, additives such as an acid generator, a surfactant and so forth. The solids of the composition range from 0.1 to 70 mass % or from 0.1 to 60 mass %. Herein, solids denote the content ratio with respect to all components, excluding the solvent from the composition for forming a resist underlayer film. The proportion of the content of the abovementioned polymer in the solids can be 1 to 100 mass %, or 1 to 99.9 mass %, or 50 to 99.9 mass % or 50 to 95 mass %, or 50 to 90 mass %.

The weight-average molecular weight of the polymer used in the present invention ranges from 600 to 1,000,000, or from 600 to 200,000.

In formula (1), $R_1$ and $R_2$ may be, each independently, a hydrogen atom, a halogen atom, a nitro group, an amino group, a hydroxy group, a $C_{1-10}$ alkyl group, a $C_{2-10}$ alkenyl group or a $C_{6-40}$ aryl group, or a combination of the foregoing functional groups optionally having an ether linkage, a ketone linkage, or an ester linkage.

$R_3$ may be a hydrogen atom, a $C_{1-10}$ alkyl group, a $C_{2-10}$ alkenyl group, a $C_{6-40}$ aryl group, or a combination of the foregoing functional groups optionally having an ether linkage, a ketone linkage, or an ester linkage.

$R_4$ may be a hydrogen atom, or may be a $C_{6-40}$ aryl group or heterocyclic group optionally substituted with a halogen atom, a nitro group, an amino group or a hydroxy group.

$R_5$ may be a hydrogen atom, or may be a $C_{1-10}$ alkyl group, a $C_{6-40}$ aryl group or a heterocyclic group optionally substituted with a halogen atom, a nitro group, an amino group or a hydroxy group; $R_4$ and $R_5$ may form a ring with each other, wherein examples of such a ring include a ring having a structure in which $R_4$ and $R_5$ are each linked to position 9 of fluorene; and n1 and n2 are each an integer from 1 to 3.

In formula (2), Ar is a $C_{6-20}$ aromatic ring group; $R_6$ is a hydroxy group; $R_7$ is a hydrogen atom, a halogen atom, a nitro group, an amino group, a $C_{1-10}$ alkyl group, a $C_{2-10}$ alkenyl group, a $C_{6-40}$ aryl group, or a combination of the foregoing groups optionally having an ether linkage, a ketone linkage or an ester linkage.

$R_8$ may be a hydrogen atom, or may be a $C_{6-40}$ aryl group or heterocyclic group optionally substituted with a halogen atom, a nitro group, an amino group or a hydroxy group.

$R_9$ may be a hydrogen atom, or may be a $C_{1-10}$ alkyl group, a $C_{6-40}$ aryl group or a heterocyclic group optionally substituted with a halogen atom, a nitro group, an amino group or a hydroxy group; $R_8$ and $R_9$ may form a ring with each other; n6 is an integer from 1 to p, and n7 is an integer p-n6, where p is the maximum number of substituents with which the aromatic ring group Ar can be substituted.

Ar is a benzene ring, a naphthalene ring, an anthracene ring or the like, preferably a naphthalene ring. In a case where Ar is a benzene ring, n6 is an integer from 1 to 4, and n7 is an integer [4-(n6)]. In a case where Ar is a naphthalene ring, n6 is an integer from 1 to 6, and n7 is an integer [6-(n6)]. In a case where Ar is an anthracene ring, n6 is an integer from 1 to 8, and n7 is an integer [8-(n6)].

Examples of halogen atoms include, for instance, fluorine atoms, chlorine atoms, bromine atoms and iodine atoms.

Examples of $C_{1-10}$ alkyl groups include, for instance, a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Examples of $C_{2-10}$ alkenyl groups include, for instance, an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-n-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group and a 3-cyclohexenyl group.

Examples of $C_{6-40}$ aryl groups include, for instance, a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group.

The heterocyclic group is preferably, for example, an organic group composed of a five- to six-membered heterocyclic ring having nitrogen, sulfur or oxygen; examples include a pyrrole group, a furan group, a thiophene group, an imidazole group, an oxazole group, a thiazole group, a pyrazole group, an isoxazole group, an isothiazole group and a pyridine group.

In a preferred instance, $R_1$, $R_2$, $R_3$, and $R_5$ in formula (1) are hydrogen atoms, and $R_4$ is a naphthalene ring or a pyrene ring.

In a preferred instance, Ar in formula (2) is a naphthalene ring, $R_7$ and $R_9$ are hydrogen atoms, and $R_8$ is a naphthalene ring or a pyrene ring.

Examples of the carbazole that is used in the present invention include, for instance, carbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxaldehyde, 9-benzylcarbazole-3-carboxaldehyde, 9-methylcarbazole, 9-phenylcarbazole, 9-vinylcarbazole, carbazole potassium, carbazole-N-carbonyl chloride, N-ethylcarbazole-3-carboxaldehyde, and N-((9-ethylcarbazol-3-yl)methylene)-2-methyl-1-indolynyl amine. The foregoing may be used singly or in combination of two or more types.

Examples of the hydroxy group-containing aromatic compound used to produce the polymer of the present invention include, for instance, phenol, dihydroxybenzene, trihydroxybenzene, naphthol, dihydroxynaphthalene, trihydroxynaphthalene, hydroxyanthracene, dihydroxyanthracene, trihydroxyanthracene and the like.

Examples of the aldehyde used for producing the polymer of the present invention include, for instance, saturated aliphatic aldehydes such as formaldehyde, paraformaldehyde, acetaldehyde, propylaldehyde, butyraldehyde, isobutyraldehyde, valeraldehyde, caproaldehyde, 2-methylbutyraldehyde, hexanal, undecanal, 7-methoxy-3,7-dimethyloctyl aldehyde, cyclohexanal, 3-methyl-2-butyraldehyde, glyoxal, malonaldehyde, succinaldehyde, glutaraldehyde, glutaraldehyde, and adipaldehyde; unsaturated aliphatic aldehydes such as acrolein and methacrolein; heterocyclic aldehydes such as furfural and pyridine aldehyde; and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde. Aromatic aldehydes can be preferably used in particular.

Examples of the ketone that is used to produce the polymer of the present invention include, for instance, diaryl ketones, for instance, diphenyl ketone, phenyl naphthyl ketone, dinaphthyl ketone, phenyl tolyl ketone, ditolyl ketone, and 9-fluorenone.

The polymer used in the present invention is a novolac resin obtained through condensation of a carbazole and a hydroxy group-containing aromatic compound with an aldehyde or ketone. In the condensation reaction, the aldehyde or ketone can be used in a proportion of 0.1 to 10 equivalents with respect to 1 equivalent of phenyl groups that are included in the carbazole and the hydroxy group-containing aromatic compound and involved in the reaction.

Examples of the acid catalyst that is used in the abovementioned condensation reaction include, for instance, mineral acids such as sulfuric acid, phosphoric acid, and perchloric acid; organic sulfonic acids such as p-toluenesulfonic acid and p-toluenesulfonic acid monohydrate; and carboxylic acids such as formic acid and oxalic acid. The use amount of the acid catalyst is properly selected depending on the type of an acid to be used. Ordinarily, the amount is 0.001 to 10,000 parts by mass, preferably 0.01 to 1,000 parts by mass, and more preferably 0.1 to 100 parts by mass with respect to 100 parts by mass of the carbazole, or the total of the carbazole plus the hydroxy group-containing aromatic compound.

The above condensation reaction may be conducted without a solvent, but is ordinarily carried out using a solvent. Any solvent can be used as long as the reaction is not inhibited. Examples of the solvent include cyclic ethers such as tetrahydrofuran and dioxane. If the acid catalyst that is used is a liquid acid such as formic acid, the catalyst can also serve as the solvent.

The reaction temperature during condensation ranges ordinarily from 40° C. to 200° C. The reaction time is variously selected depending on the reaction temperature, but ranges ordinarily from about 30 minutes to about 50 hours.

The weight-average molecular weight Mw of the polymer thus obtained ranges ordinarily from 600 to 1,000,000, or from 600 to 200,000.

Examples of the polymer having the unit structure of formula (1) and the unit structure of formula (2) include the following.

Formula (3-1)

Formula (3-2)

Formula (3-3)

Formula (3-4)

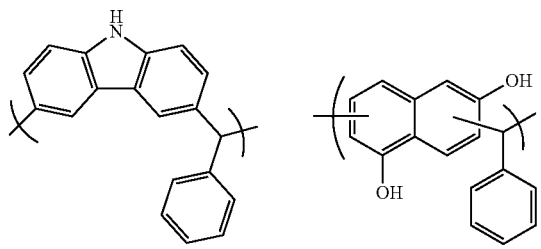

Formula (3-5)

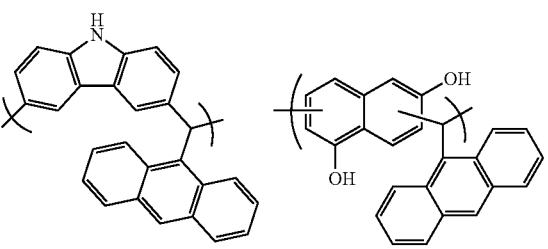

Formula (3-6)

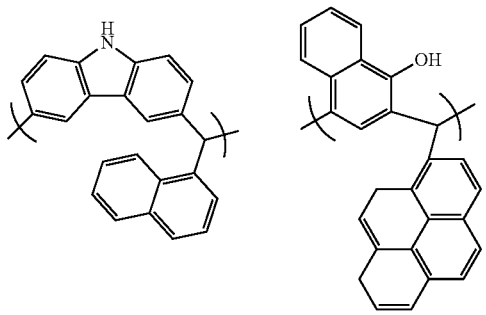

Formula (3-7)

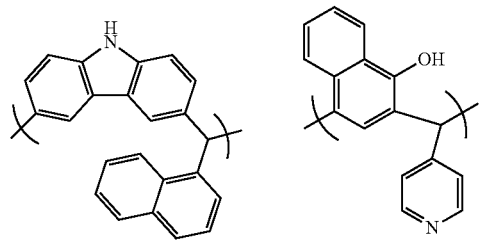

Formula (3-8)

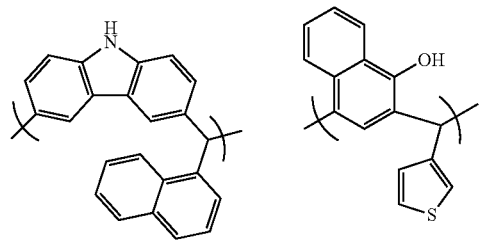

-continued

Formula (3-9)

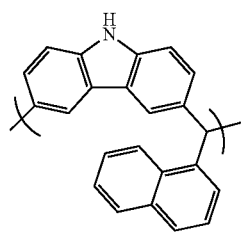 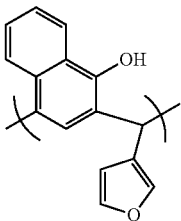

Formula (3-10)

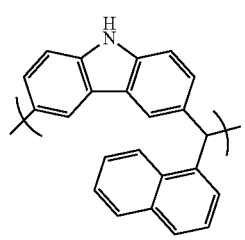 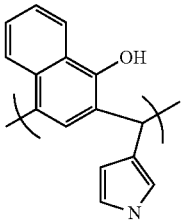

Formula (3-11)

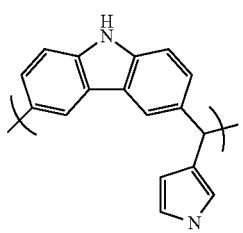 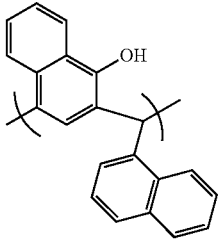

Formula (3-12)

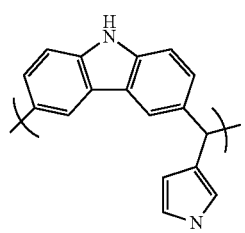 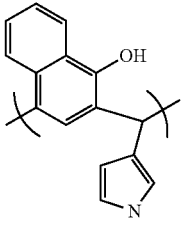

Formula (3-13)

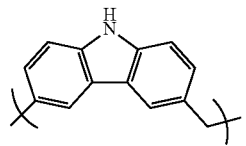 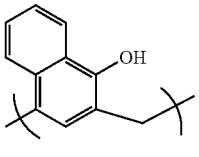

The abovementioned polymers can be used by being mixed with other polymers, with the latter not exceeding 30 mass % of the total polymers.

Examples of these polymers include, for instance, polyacrylate compounds, polymethacrylate compounds, polyacrylamide compounds, polymethacrylamide compounds, polyvinyl compounds, polystyrene compounds, polymaleimide compounds, polymaleic anhydride and polyacrylonitrile compounds.

Examples of starting-material monomers of polyacrylate compounds include, for instance, methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxydiethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxy-butyl-2-adamantyl acrylate, 8-methyl-8-tricyclodecyl acrylate, 8-ethyl-8-tricyclodecyl acrylate and 5-acryloyloxy-6-hydroxy-norbornene-2-carboxylic-6-lactone.

Examples of starting-material monomers of polymethacrylate compounds include, for instance, ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, iso-decyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxy-norbornene-2-carboxylic-6-lactone, and 2,2,3,3,4,4,4-heptafluorobutyl methacrylate.

Examples of acrylamide compounds include, for instance, acrylamide, N-methyl acrylamide, N-ethyl acrylamide, N-benzyl acrylamide, N-phenyl acrylamide, and N,N-dimethylacrylamide.

Examples of starting-material monomers of poly(methacrylamide) compounds include, for instance, methacrylamide, N-methyl methacrylamide, N-ethyl methacrylamide, N-benzyl methacrylamide, N-phenyl methacrylamide and N,N-dimethyl methacrylamide.

Examples of starting-material monomers of polyvinyl compounds include, for instance, vinyl ether, methyl vinyl ether, benzylvinyl ether, 2-hydroxyethylvinyl ether, phenylvinyl ether and propylvinyl ether.

Examples of starting-material monomers of polystyrene compounds include, for instance, styrene, methylstyrene, chlorostyrene, bromostyrene and hydroxystyrene.

Examples of starting-material monomers of polymaleimide compounds include, for instance, maleimide, N-methylmaleimide, N-phenylmaleimide and N-cyclohexylmaleimide.

These polymers can be produced by dissolving, in an organic solvent, addition-polymerizable monomers, and a chain transfer agent (10% or less with respect to the mass of monomers) that is added as the case may require, followed by a polymerization reaction through addition of a polymerization initiator, and addition, later on, of a polymerization terminator. The addition amount of the polymerization initiator ranges from 1 to 10%, and the addition amount of the polymerization terminator ranges from 0.01 to 0.2 mass % with respect to the mass of monomers. Examples of the organic solvent that is used include, for instance, propylene glycol monomethyl ether, propylene glycol monopropyl ether, ethyl lactate, cyclohexane, methyl ethyl ketone, dimethylformamide or the like. Examples of the chain transfer agent include, for instance, dodecanethiol and dodecylthiol. Examples of the polymerization initiator include, for instance, azobisisobutyronitrile and azobiscyclohexanecarbonitrile. Examples of the polymerization terminator include, for instance, 4-methoxyphenol. The reaction temperature can be appropriately selected in a range from 30 to 100° C., and the reaction time in a range from 1 to 48 hours.

The composition for forming a resist underlayer film of the present invention can contain a cross-linking agent component. Examples of cross-linking agents include, for instance, melamine-based cross-linking agents, substituted urea-based cross-linking agents, or polymers of the foregoing. Preferably, the cross-linking agent component is a cross-linking agent having at least two cross-linking substituents, and is a compound such as methoxymethylated glycoluril, butoxymethylated glycoluril, methoxymethylated melamine, melamine butoxymethyl, methoxymethylated benzoguanamine, butoxymethylated benzoguanamine, methoxymethylated urea, butoxymethylated urea, methoxymethylated thiourea or methoxymethylated thiourea. Condensates of the foregoing compounds can also be used.

A cross-linking agent having high heat resistance can be used as the cross-linking agent. As the cross-linking agent having high heat resistance there can be preferably used a compound containing a cross-linking substituent having an aromatic ring (for instance, a benzene ring or a naphthalene ring) in the molecule.

Examples of such compounds include compounds having a moiety structure of formula (4) below, or polymers or oligomers having a repeating unit of formula (5) below.

In formula (4), $R_{10}$ and $R_{11}$ are each independently a hydrogen atom, a $C_{1-10}$ alkyl group or a $C_{6-20}$ aryl group; n10 is an integer from 1 to 4; n11 is an integer from 1 to (5-n10); and (n10+n11) is an integer from 2 to 5.

In formula (5), $R_{12}$ is a hydrogen atom or a $C_{1-10}$ alkyl group; $R_{13}$ is a $C_{1-10}$ alkyl group; n12 is an integer from 1 to 4; n13 is 0 to (4-n12); and (n12+n13) is an integer from 1 to 4. There can be used oligomers and polymers having 2 to 100 or 2 to 50 repeating unit structures.

Examples of the alkyl groups and aryl groups include the alkyl groups and aryl groups described above.

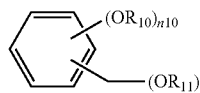

Formula (4)

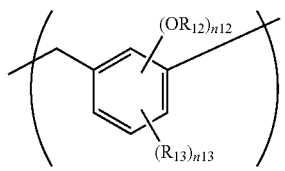

Formula (5)

Examples of the compounds, polymers and oligomers of formula (4) and formula (5) are given below.

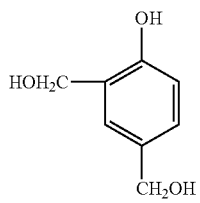

Formula (4-1)

-continued

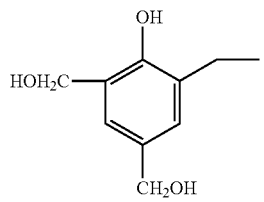

Formula (4-2)

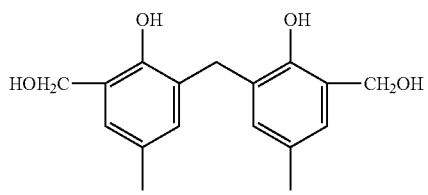

Formula (4-3)

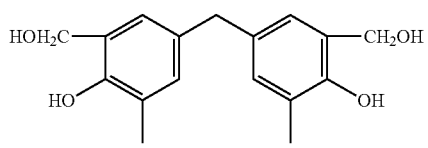

Formula (4-4)

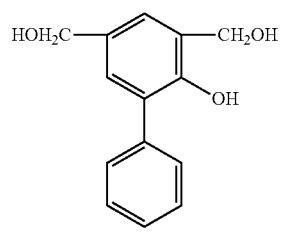

Formula (4-5)

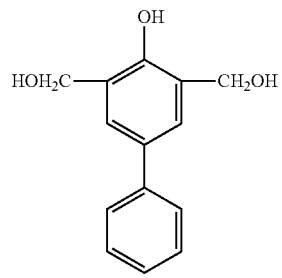

Formula (4-6)

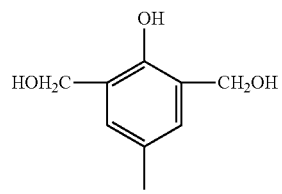

Formula (4-7)

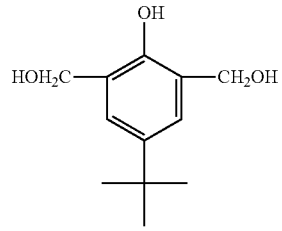

Formula (4-8)

Formula (4-9), Formula (4-10), Formula (4-11), Formula (4-12), Formula (4-13), Formula (4-14), Formula (4-15), Formula (4-16), Formula (4-17), Formula (4-18), Formula (4-19), Formula (4-20), Formula (4-21), Formula (4-22), Formula (4-23)

-continued

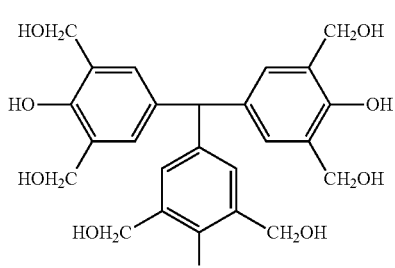

Formula (4-24)

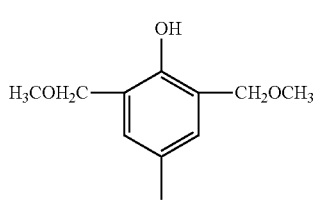

Formula (4-25)

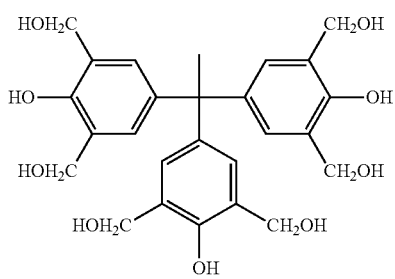

Formula (4-26)

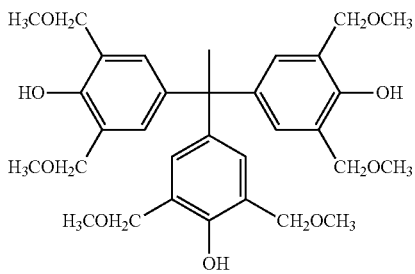

Formula (4-27)

The above compounds are products available from Asahi Organic Chemicals Industry Co., LTD. and Honshu Chemical Industry Co., Ltd. For instance, the compound of formula (4-21) among the cross-linking agents is available as TM-BIP-A, trade name, by Asahi Organic Chemicals Industry Co., LTD.

The addition amount of the cross-linking agent varies depending on the coating solvent that is used, the underlying substrate that is used, the required solution viscosity, the required film shape and the like, but ranges from 0.001 to 80 mass %, preferably from 0.01 to 50 mass %, and more preferably 0.05 to 40 mass %, with respect to total solids. These cross-linking agents elicit a cross-linking reaction through self-condensation, but the cross-linking reaction can be elicited with cross-linkable substituents, if any, that may be present in the polymer of the present invention.

In the present invention, an acidic compound such as p-toluenesulfonic acid, trifluoromethanesulfonic acid, pyridinium p-toluenesulfonate, salicylic acid, sulfosalicylic acid, citric acid, benzoic acid, hydroxybenzoic acid, naphthalenecarboxylic acid and/or a thermal acid generator such as 2,4,4,6-tetrabromocyclohexadienone, benzoin tosylate, 2-nitrobenzyl tosylate or another organic alkylester sulfonate can be blended in as a catalyst for promoting the abovementioned cross-linking reaction. The blending amount of the catalyst ranges from 0.0001 to 20 mass %, preferably from 0.0005 to 10 mass % and preferably from 0.01 to 3 mass % with respect to total solids.

A photoacid generator can be added to the coating-type underlayer film formation composition for lithography of the present invention, in order to match acidity with that of the photoresist that is overlaid in the lithography process. Examples of preferred photoacid generators include, for instance, onium salt-based photoacid generators such as bis(4-t-butylphenyl)iodonium trifluoromethanesulfonate, triphenyl sulfonium trifluoromethanesulfonate or the like; halogen-containing compound-based photoacid generators such as phenyl-bis(trichloromethyl)-s-triazine or the like; and sulfonic acid-based photoacid generators such as benzoin tosylate, N-hydroxysuccinimide trifluoromethanesulfonate or the like. The blending amount of the photoacid generator ranges from 0.2 to 10 mass %, preferably from 0.4 to 5 mass % with respect to total solids.

A light absorber, rheology modifier, adhesion aid, surfactant and so forth other than the abovementioned compounds can be further added, as the case may require, to the underlayer film material of resist for lithography of the present invention.

Examples of the light absorber that can be appropriately used include, for instance, the commercially available light absorbers set forth in "Kogyo-yo Shikiso no Gijutsu to Shijo (Technology and Market of Industrial Dyes)" (CMC Publishing) or "Senryo Binran (Handbook for Dyes)" (edited by The Society of Synthetic Organic Chemistry, Japan), for example C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The abovementioned light absorbers are ordinarily added in a proportion of 10 mass % or less, preferably 5 mass % or less, with respect to the total solids of the underlayer film material of resist for lithography.

The rheology modifier is mainly added for the purpose of enhancing the fluidity of the composition for forming a resist underlayer film, and, particularly, in a baking step, of enhancing thickness uniformity of the resist underlayer film and of enhancing the filling ability of the composition for forming a resist underlayer film into holes. Specific examples of the rheology modifier include, for instance, phthalic acid derivatives such as dimethyl phthalate, diethyl phthalate, diisobutyl phthalate, dihexyl phthalate, butylisodecyl phthalate or the like; adipic acid derivatives such as di-n-butyl adipate, diisobutyl adipate, diisooctyl adipate, octyl decyl adipate or the like; maleic acid derivatives such as di-n-butyl maleate, diethyl maleate, dinonyl maleate or the like; oleic acid derivatives such as methyl oleate, butyl oleate, tetratetrahydrofurfuryl oleate or the like; or stearic acid derivatives such as n-butyl stearate, glyceryl stearate or the like. The rheology modifier is added in a proportion ordinarily smaller than 30 mass % with respect to the total solids of the underlayer film material of resist for lithography.

The adhesion aid is added mainly for the purpose of enhancing the adhesiveness between the composition for forming a resist underlayer film and the substrate or the resist, and in particular, preventing the resist from peeling off during developing. Specific examples of the adhesion aid include, for instance, chlorosilanes such as trimethylchlorosilane, dimethylvinylchlorosilane, methyldiphenylchlorosilane, chloromethyldimethylchlorosilane or the like; alkoxysilanes such as trimethylmethoxysilane, dimethyldiethoxysilane, methyldimethoxysilane, dimethylvinylethoxysilane, diphenyldimethoxysilane, phenyltriethoxysilane or the like; silazanes such as hexamethyldisilazane, N,N'-bis(trimethylsilyl) urea, dimethyltrimethylsilylamine, trimethylsilylimidazole or the like; silanes such as vinyltrichlorosilane, γ-chloropropyltrimethoxysilane, γ-aminopropyltriethoxysilane, γ-glycidoxypropyltrimethoxysilane or the like; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine or the like; as well as urea and thiourea compounds such as 1,1-dimethylurea, 1,3-dimethylurea or the like. The adhesion aid is added in a proportion ordinarily smaller than 5 mass %, preferably smaller than 2 mass %, with respect to the total solids of the underlayer film material of resist for lithography.

A surfactant can be blended into the underlayer film material of resist for lithography of the present invention in order to further enhance coatability against surface unevenness, without occurrence of pinholes, striations or the like. Examples of the surfactant include, for instance nonionic surfactants such as, polyoxyethylene alkyl ethers, for example polyoxyethylene lauryl ether, polyoxyethylene stearyl ether, polyoxyethylene cetyl ether, polyoxyethylene oleyl ether or the like; polyoxyethylene alkylallyl ethers such as polyoxyethylene octylphenol ether, polyoxyethylene nonylphenol ether or the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate or the like; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate or the like; fluorine based surfactants, for instance EFTOP EF301, EF303, EF352 (trade name, by Mitsubishi Material Electronic Chemicals Co., Ltd.), MEGAFAC F171, F173, R-30 (trade name, by DIC Corporation), FLUORAD FC430, FC431 (trade name, by Sumitomo 3M Limited), ASAHI GUARD AG710, SURFLON S-382, SC 101, SC102, SC103, SC104, SC105, SC106 (trade name, by Asahi Glass Co., Ltd.); or an organosiloxane polymer KP341 (trade name, by Shin-Etsu Chemical Co., Ltd.). The blending amount of the surfactant is ordinarily 2.0 mass % or less, preferably 1.0 mass % or less with respect to the total solids of the underlayer film material of resist for lithography of the present invention. These surfactants may be added singly or in combinations of two or more types.

Examples of solvents that dissolve the polymer, cross-linking agent component, cross-linking catalyst and so forth of the present invention include, for instance, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate or the like. These organic solvents can be used singly or in combinations of two or more types.

High-boiling point solvents such as propylene glycol monobutyl ether, propylene glycol monobutyl ether acetate or the like can be used in the mixture. Among the foregoing, propylene glycol monomethyl ether, propylene glycol monomethyl ether acetate, ethyl lactate, butyl lactate, and cyclohexanone or the like are preferably used to enhance leveling.

The resist used in the present invention is a photoresist or electron beam resist.

A positive-type photoresist or negative-type photoresist may be used as the photoresist that is applied onto the resist underlayer film for lithography of the present invention. The photoresist may be, for instance, a positive-type photoresist including a novolac resin and 1,2-naphthoquinone diazide sulfonate; a chemically-amplified type photoresist including a photoacid generator and a binder having a group that is decomposed by an acid and that increases the alkali dissolution rate; a chemically-amplified type photoresist including an alkali-soluble binder, a low molecular compound that is decomposed by an acid and that increases the alkali dissolution rate of the photoresist, and a photoacid generator; a chemically-amplified photoresist including a binder having a group that is decomposed by an acid and that increases the alkali dissolution rate, a low molecular compound that is decomposed by an acid and that increases the alkali dissolution rate of the photoresist, and a photoacid generator; a photoresist having Si atoms in the skeleton; or, for instance, APEX-E (trade name) by Rohm and Haas.

Examples of an electron beam resist that is applied onto the top of a resist underlayer film for lithography of the present invention include, for instance, a composition made up of a resin that includes Si—Si bonds in the main chain and that includes aromatic rings at the terminals, and of an acid generator that generates an acid when irradiated with electron beams; or a composition made up of a poly(p-hydroxystyrene) in which hydroxy groups are substituted with organic groups including N-carboxyamine, and of an acid generator that generates an acid when irradiated with electron beams. The latter electron beam resist composition includes instances wherein the acid generated by the acid generator as a result of electron beam irradiation reacts with N-carboxyaminoxy groups at side chains of the polymer, whereupon the polymer side chains break down into hydroxy groups, and the polymer becomes alkali-soluble and dissolves in an alkaline developer, to form a resist pattern. Examples of the acid generator that generates an acid as a result of irradiation of electron beams include, for instance, halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, 2-chloro-6-(trichloromethyl)pyridine or the like; as well as onium salts such as a triphenyl sulfonium salt and a diphenyl iodonium salt; and sulfonic acid esters such as nitrobenzyl tosylate and dinitrobenzyl tosylate.

Examples of the developer of the resist having the resist underlayer film that is formed using the underlayer film material of resist for lithography of the present invention include, for instance, aqueous solutions of alkalis including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. An alcohol such as isopropyl alcohol or a surfactant such as a nonionic surfactant can be used by being added to such an aqueous alkaline solution in appropriate amounts. Preferred developers among the foregoing developers are quaternary ammonium salts, more preferably tetramethylammonium hydroxide and choline.

In the method for forming a resist pattern of the present invention explained next, a coating-type underlayer film is produced by applying the composition for forming a resist underlayer film, in accordance with an appropriate coating method, using a spinner, a coater or the like, onto a substrate (for instance, a transparent substrate such as a silicon/silicon dioxide coat, a glass substrate, an ITO substrate or the like) that is used in the fabrication of precision integrated circuit elements. Preferably, the thickness of the resist underlayer film ranges from 0.01 to 3.0 p.m. The conditions of baking after application include, for instance, 80 to 350° C. for 0.5 to 120 minutes. Thereafter, a resist is applied directly onto the resist underlayer film, or, as the case may require, on a film resulting from applying one to several layers of a coating film material onto a coating-type underlayer film; this is followed by irradiation of light or electron beams via a predetermined mask, and by developing, rinsing and drying. A good resist pattern can be obtained as a result. As the case may require, heating may be performed after irradiation of light or electron beams (post exposure baking: PEB). The resist underlayer film is then removed, by dry etching, from the portions at which the resist had been removed, through development, in the above-described process. A desired pattern can be thus formed on the substrate.

The exposure light in the abovementioned photoresist is actinic rays such as near-ultraviolet rays, far-ultraviolet rays, and extreme-ultraviolet rays (for example, EUV, wavelength of 13.5 nm). Herein there can be used, for instance, light having a wavelength of 248 nm (KrF laser light), 193 nm (ArF laser light), or 157 nm ($F_2$ laser light). The light irradiation method is not particularly limited, so long as an acid can be generated out of a photoacid generator, and may involve an exposure amount ranging from 1 to 2,000 mJ/cm$^2$, from 10 to 1,500 mJ/cm$^2$, or from 50 to 1,000 mJ/cm$^2$.

Electron beam irradiation of the electron beam resist may be accomplished using for instance an electron beam irradiation device.

According to the present invention, a semiconductor device can be produced through: a step of forming the resist underlayer film, using the composition for forming a resist underlayer film, on a semiconductor substrate; a step of forming a resist film on the resist underlayer film; a step of forming a resist pattern by irradiation of light or electron beams, and by developing; a step of etching the resist underlayer film by way of the resist pattern; and a step of processing the semiconductor substrate by way of the patterned resist underlayer film.

Thinner resists have become desirable as a response to the problems of resolution and resist pattern collapse after development that arise as resist patterns become ever thinner. Accordingly, achieving sufficient resist pattern thickness for substrate processing was difficult, and thus processes have become necessary in which the function of a mask during substrate processing is imparted not only to the resist pattern, but also to a resist underlayer film that is produced between the resist and the semiconductor substrate to be processed. Such resist underlayer films for processing that are now required include resist underlayer films for lithography having a selection ratio of dry etching rate close to that of the resist, resist underlayer films for lithography having a selection ratio of dry etching rate smaller than that of the resist, and resist underlayer films for lithography having a selection ratio of dry etching rate smaller than that of the semiconductor substrate, which are different from conventional resist underlayer films having high etch rate (high etching rate). Such resist underlayer films can be imparted with an anti-reflection function, and also with the function of a conventional anti-reflective coating.

In order to achieve fine resist patterns, processes have also begun to be used wherein a resist pattern and a resist underlayer film upon dry etching of a resist underlayer film are set to be thinner than the pattern width at the time of resist development. Resist underlayer films having a selection ratio of dry etching rate close to that of the resist, unlike conventional high etch rate anti-reflective coatings, have come to be required as resist underlayer films for such processes. Such resist underlayer films can be imparted with an anti-reflection function and also with the function of a conventional anti-reflective coating.

In the present invention, the resist underlayer film of the present invention is formed on a substrate; thereafter a resist can be applied directly onto the resist underlayer film, or, as the case may require, on a film resulting from forming one to several layers of a coating film material on the resist underlayer film. Accordingly, the substrate can be processed by selecting an appropriate etching gas, even if the pattern width of the resist is narrow and the resist is thinly covered in order to prevent pattern collapse.

Specifically, a semiconductor device can be produced through: a step of forming the resist underlayer film, using the composition for forming a resist underlayer film, on a semiconductor substrate; a step of forming, on the resist underlayer film, a hard mask by a coating film material that contains a silicon component or the like, or a hard mask by vapor deposition (for instance, of silicon oxynitride); a step of further forming a resist film on the hard mask; a step of forming a resist pattern by irradiation of light or electron beams, and by developing; a step of etching the hard mask by way of the resist pattern, using a halogen-based gas; a step of etching the resist underlayer film, by way of the patterned hard mask, using an oxygen-based gas or a hydrogen-based gas; and a step of processing the semiconductor substrate by way of the patterned resist underlayer film, using a halogen-based gas.

When considering the effect as an anti-reflective coating of a composition for forming a resist underlayer film for lithography of the present invention, it is found that the light-absorbing moieties are incorporated in the skeleton and hence no material diffuses into the photoresist during heating and drying. Moreover, the light-absorbing moieties have sufficiently large light-absorbing ability, and hence the anti-reflection effect is accordingly high.

The composition for forming a resist underlayer film for lithography of the present invention exhibits high thermal stability, can prevent contamination at the top-layer film caused by decomposition products during baking, and affords some temperature margin during the baking step.

The underlayer film material of resist for lithography of the present invention can be used as a film that, depending on the process conditions, has a function of preventing reflection of light, and a function of preventing interactions between the substrate and the photoresist, or preventing adverse effects on the substrate caused by materials that are used in the photoresist or by substances that are generated in the photoresist during exposure.

EXAMPLES

Synthesis Example 1

Into a 200 ml three-necked flask, 8.36 g of carbazole (by Tokyo Chemical Industry), 7.21 g of 1-naphthol (by Tokyo Chemical Industry), 15.62 g of 1-naphthoaldehyde (by Tokyo Chemical Industry), 124.75 g of toluene (by Kanto Chemical) and 0.48 g of p-toluenesulfonic acid monohydrate (by Tokyo Chemical Industry) were charged. Thereafter, the interior of the flask was purged with nitrogen, and then the flask was heated up to 130° C., with stirring under reflux for about 9 hours. After the reaction was over, the product was diluted with 31.14 g of tetrahydrofuran (by Kanto Chemical), and the precipitate was removed by filtration. The recovered filtrate was dripped onto a mixed solution of methanol/28% aqueous ammonia (389 g/3 g), to elicit re-precipitation. The obtained precipitate was suction-filtered, and the filtered product was dried under reduced pressure overnight at 85° C. There were obtained 17.45 g of a beige powder of a carbazole resin. The obtained polymer corresponded to formula (3-1). The weight-average molecular weight Mw measured in terms of polystyrene equivalent by GPC was 4,200. The obtained polymer contained a proportion of 50 mol % of the unit structure of formula (1) and 50 mol % of the unit structure of formula (2).

Synthesis Example 2

Into a 200 ml three-necked flask, 11.70 g of carbazole (by Tokyo Chemical Industry), 4.32 g of 1-naphthol (by Tokyo Chemical Industry), 15.62 g of 1-naphthoaldehyde (by Tokyo Chemical Industry), 124.75 g of toluene (by Kanto Chemical) and 0.48 g of p-toluenesulfonic acid monohydrate (by Tokyo Chemical Industry) were charged. Thereafter, the interior of the flask was purged with nitrogen, and then the flask was heated up to 130° C., with stirring under reflux for about 9 hours. After the reaction was over, the product was diluted with 32.06 g of tetrahydrofuran (by Kanto Chemical), and the precipitate was removed by filtration. The recovered filtrate was dripped onto a mixed solution of methanol/28% aqueous ammonia (400 g/3 g), to elicit re-precipitation. The obtained precipitate was suction-filtered, and the filtered product was dried under reduced pressure overnight at 85° C. There were obtained 17.32 g of a beige powder of a carbazole resin. The obtained polymer corresponded to formula (3-1). The weight-average molecular weight Mw measured in terms of polystyrene equivalent by GPC was 4,500. The obtained polymer contained a proportion of 70 mol % of the unit structure of formula (1) and 30 mol % of the unit structure of formula (2).

Synthesis Example 3

Into a 200 ml three-necked flask, 5.18 g of carbazole (by Tokyo Chemical Industry), 10.43 g of 1-naphthol (by Tokyo Chemical Industry), 16.14 g of 1-naphthoaldehyde (by Tokyo Chemical Industry), 127.00 g of toluene (by Kanto Chemical) and 0.49 g of p-toluenesulfonic acid monohydrate (by Tokyo Chemical Industry) were charged. Thereafter, the interior of the flask was purged with nitrogen, and then the flask was heated up to 130° C., with stirring under reflux for about 8 hours. After the reaction was over, the product was diluted with 31.22 g of tetrahydrofuran (by Kanto Chemical), and the precipitate was removed by filtration. The recovered filtrate was dripped onto a mixed solution of methanol/28% aqueous ammonia (390 g/3 g), to elicit re-precipitation. The obtained precipitate was suction-filtered, and the filtered product was dried under reduced pressure overnight at 85° C. There were obtained 9.24 g of a brown powder of a carbazole resin. The obtained polymer corresponded to formula (3-1). The weight-average molecular weight Mw measured in terms of polystyrene equivalent by GPC was 2,700. The obtained polymer contained a proportion of 30 mol % of the unit structure of formula (1) and 70 mol % of the unit structure of formula (2).

Synthesis Example 4

Into a 100 ml three-necked flask, 0.50 g of carbazole (by Tokyo Chemical Industry), 3.89 g of 1-naphthol (by Tokyo Chemical Industry), 4.69 g of 1-naphthoaldehyde (by Tokyo Chemical Industry), 18.16 g of toluene (by Kanto Chemical) and 0.14 g of p-toluenesulfonic acid monohydrate (by Tokyo Chemical Industry) were charged. Thereafter, the interior of the flask was purged with nitrogen, and then the flask was heated up to 130° C., with stirring under reflux for about 8 hours. After the reaction was over, the product was diluted with 13.18 g of tetrahydrofuran (by Kanto Chemical), and the precipitate was removed by filtration. The recovered filtrate was dripped onto a mixed solution of methanol/28% aqueous ammonia (110 g/1 g), to elicit re-precipitation. The obtained precipitate was suction-filtered, and the filtered product was dried under reduced pressure overnight at 85° C. There were obtained 4.08 g of a brown powder of a carbazole resin. The obtained polymer corresponded to formula (3-1). The weight-average molecular weight Mw measured in terms of polystyrene equivalent by GPC was 2,400. The obtained polymer contained a proportion of 10 mol % of the unit structure of formula (1) and 90 mol % of the unit structure of formula (2).

Synthesis Example 5

6.00 g of carbazole (by Tokyo Chemical Industry), 3.83 g of 1,6-dihydroxynaphthalene (by Tokyo Chemical Industry), and 9.43 g of 1-naphthoaldehyde (by Tokyo Chemical Industry) were dissolved in 47.18 g of 2-n-butoxyethanol; this was followed by heating at 100° C. under a nitrogen stream, and reaction for 20 hours. The reaction solution was cooled, and was then re-precipitated through dripping onto methanol. The obtained solid was dried through heating to yield the polymer of formula (3-2). The weight-average molecular weight of the obtained polymer was 2,600 in polystyrene equivalent. The obtained polymer contained a proportion of 60 mol % of the unit structure of formula (1) and 40 mol % of the unit structure of formula (2).

Synthesis Example 6

4.00 g of carbazole (by Tokyo Chemical Industry), 8.94 g of 1,6-dihydroxynaphthalene (by Tokyo Chemical Industry), and 12.58 g of 1-naphthoaldehyde (by Tokyo Chemical Industry) were dissolved in 50.05 g of 2-n-butoxyethanol; this was followed by heating at 130° C. under a nitrogen stream, and reaction for 24 hours. The reaction solution was cooled, and was then re-precipitated through dripping onto a mixed solvent of methanol/water (8/2). The obtained solid was dried through heating to yield the polymer of formula (3-2). The weight-average molecular weight of the obtained polymer was 1,300 in polystyrene equivalent. The obtained polymer contained a proportion of 30 mol % of the unit structure of formula (1) and 70 mol % of the unit structure of formula (2).

Synthesis Example 7

7.00 g of carbazole (by Tokyo Chemical Industry), 6.99 g of 1,5-dihydroxynaphthalene (by Tokyo Chemical Industry), 20.66 g of 1-pyrenecarboxaldehyde, (by Aldrich), and 0.83 g of p-toluenesulfonic acid monohydrate (by Tokyo Chemical Industry) were added to 82.79 g of toluene, followed by about 1 hour of stirring under reflux, under a nitrogen stream. After the reaction was over, the product was diluted with 55.80 g of tetrahydrofuran (by Kanto Chemical). The reaction solution was cooled, and was then dripped onto a mixed solution of methanol/28% aqueous ammonia (700 g/7 g), to elicit re-precipitation. The obtained precipitate was suction-filtered, and the obtained powder was dried under reduced pressure overnight at 85° C., after which there were obtained 16.45 g of the polymer of formula (3-3). The weight-average molecular weight of the obtained polymer was 1,400 in polystyrene equivalent. The obtained polymer contained a proportion of 50 mol % of the unit structure of formula (1) and 50 mol % of the unit structure of formula (2).

Synthesis Example 8

1.50 g of carbazole (by Tokyo Chemical Industry), 5.60 g of 1,5-dihydroxynaphthalene (by Tokyo Chemical Industry), 10.63 g of 1-pyrenecarboxaldehyde (by Aldrich) and 0.91 g of p-toluenesulfonic acid monohydrate (by Tokyo Chemical Industry) were added to 43.50 g of 1,4-dioxane, followed by about 5 hours of stirring under reflux, under a nitrogen stream. After the reaction was over, the product was diluted with 27.42 g of tetrahydrofuran (by Kanto Chemical). The reaction solution was cooled, and was then dripped onto a mixed solution of methanol/28% aqueous ammonia (700 g/7 g), to elicit re-precipitation. The obtained precipitate was suction-filtered, and the obtained powder was dried under reduced pressure overnight at 85° C., after which there were obtained 10.48 g of the polymer of formula (3-3). The weight-average molecular weight of the obtained polymer was 2,800 in polystyrene equivalent. The obtained polymer contained a proportion of 20 mol % of the unit structure of formula (1) and 80 mol % of the unit structure of formula (2).

Synthesis Example 9

9.00 g of carbazole (by Tokyo Chemical Industry), 2.16 g of 1,5-dihydroxynaphthalene (by Tokyo Chemical Industry), 15.63 g of 1-pyrenecarboxaldehyde (by Aldrich) and 0.54 g of p-toluenesulfonic acid monohydrate (by Tokyo Chemical Industry) were added to 40.98 g of paraxylene, followed by about 5 hours of stirring under reflux, under a nitrogen stream. After the reaction was over, the product was diluted with 66.15 g of tetrahydrofuran (by Kanto Chemical). The reaction solution was cooled, and was then dripped onto a mixed solution of methanol/28% aqueous ammonia (700 g/7 g), to elicit re-precipitation. The obtained precipitate was suction-filtered, and the obtained powder was dried under reduced pressure overnight at 85° C., after which there were obtained 21.41 g of the polymer of formula (3-3). The weight-average molecular weight of the obtained polymer was 5,900 in polystyrene equivalent. The obtained polymer contained a proportion of 80 mol % of the unit structure of formula (1) and 20 mol % of the unit structure of formula (2).

Example 1

A solution of a composition for forming a resist underlayer film that is used in a lithography process with a multilayer film was prepared by dissolving 3 g of the resin obtained in Synthesis Example 1 in 12 g of propylene glycol monomethyl ether acetate.

Example 2

A solution of a composition for forming a resist underlayer film that is used in a lithography process with a multilayer film was prepared by dissolving 3 g of the resin obtained in Synthesis Example 2 in 12 g of propylene glycol monomethyl ether acetate.

Example 3

A solution of a composition for forming a resist underlayer film that is used in a lithography process with a multilayer film was prepared by dissolving 3 g of the resin obtained in Synthesis Example 3 in 12 g of propylene glycol monomethyl ether acetate.

Example 4

A solution of a composition for forming a resist underlayer film that is used in a lithography process with a multilayer film was prepared by dissolving 3 g of the resin obtained in Synthesis Example 4 in 12 g of propylene glycol monomethyl ether acetate.

Example 5

A solution of a composition for forming a resist underlayer film that is used in a lithography process with a multilayer film was prepared by mixing 0.3 g of the resin obtained in Synthesis Example 1 with 0.06 g of tetramethoxymethyl glycoluril serving as a cross-linking agent, 0.006 g of pyridinium p-toluene sulfonate serving as a catalyst, and 0.001 g of MEGAFAC R-30 serving as a surfactant, and dissolving the mixture in 2.53 g of propylene glycol monomethyl ether acetate, 0.84 g of propylene glycol monomethyl ether and 0.84 g of cyclohexanone.

Example 6

A solution of a composition for forming a resist underlayer film that is used in a lithography process with a multilayer film was prepared by mixing 0.3 g of the resin obtained in Synthesis Example 2 with 0.06 g of tetramethoxymethyl glycoluril serving as a cross-linking agent, 0.006 g of pyridinium p-toluene sulfonate serving as a catalyst, and 0.001 g of MEGAFAC R-30 serving as a surfactant, dissolution in 2.53 g of propylene glycol monomethyl ether acetate, 0.84 g of propylene glycol monomethyl ether and 0.84 g of cyclohexanone.

Example 7

A solution of a composition for forming a resist underlayer film that is used in a lithography process with a multilayer film was prepared by mixing 0.6 g of the resin obtained in Synthesis Example 3 with 0.15 g of tetramethoxymethyl glycoluril serving as a cross-linking agent, 0.015 g of pyridinium p-toluene sulfonate serving as a catalyst, and 0.002 g of MEGAFAC R-30 serving as a surfactant, and dissolving the mixture in 7.06 g of propylene glycol monomethyl ether acetate and 1.76 g of propylene glycol monomethyl ether.

Example 8

A solution of a composition for forming a resist underlayer film that is used in a lithography process with a multilayer film was prepared by mixing 1.0 g of the resin obtained in Synthesis Example 5 with 0.20 g of tetramethoxymethyl glycoluril serving as a cross-linking agent, 0.020 g of pyridinium p-toluene sulfonate serving as a catalyst, and 0.003 g of MEGAFAC R-30 serving as a surfactant, and dissolving the mixture in 3.97 g of propylene glycol monomethyl ether acetate, 3.96 g of propylene glycol monomethyl ether and 11.90 of cyclohexanone.

Example 9

A solution of a composition for forming a resist underlayer film that is used in a lithography process with a multilayer film was prepared by mixing 1.0 g of the resin obtained in Synthesis Example 6 with 0.25 g of tetramethoxymethyl glycoluril serving as a cross-linking agent, 0.013 g of pyridinium p-toluene sulfonate serving as a catalyst, and 0.003 g of MEGAFAC R-30 serving as a surfactant, and dissolving the mixture in 3.97 g of propylene glycol monomethyl ether acetate, 3.96 g of propylene glycol monomethyl ether and 11.90 of cyclohexanone.

Example 10

A solution of a composition for forming a resist underlayer film that is used in a lithography process with a multilayer film was prepared by mixing 2.0 g of the resin obtained in Synthesis Example 7 with 0.006 g of MEGAFAC R-30 serving as a surfactant, and dissolving the mixture in 3.97 g of propylene glycol monomethyl ether acetate, 2.16 g of propylene glycol monomethyl ether and 18.84 of cyclohexanone.

Example 11

A solution of a composition for forming a resist underlayer film that is used in a lithography process with a multilayer film was prepared by mixing 2.0 g of the resin obtained in Synthesis Example 8 with 0.006 g of MEGAFAC R-30 serving as a surfactant, and dissolving the mixture in 3.97 g of propylene glycol monomethyl ether acetate, 2.16 g of propylene glycol monomethyl ether and 18.84 g of cyclohexane.

Example 12

A solution of a composition for forming a resist underlayer film that is used in a lithography process with a multilayer film was prepared by mixing 2.0 g of the resin obtained in Synthesis Example 9 with 0.006 g of MEGAFAC R-30 serving as a surfactant, and dissolving the mixture in 3.97 g of propylene glycol monomethyl ether acetate, 2.16 g of propylene glycol monomethyl ether and 18.84 g of cyclohexane.

Comparative Example 1

A solution of a cresol novolac resin (commercially available product, weight-average molecular weight 4,000) was used.

(Measurement of Optical Parameters)

The resist underlayer film solutions prepared in Examples 1 to 12 and Comparative Example 1 were applied onto silicon wafers using a spin coater. Each applied solution was baked on a hot plate at 240° C. for 1 minute (at 400° C. for 2 minutes in Examples 10 to 12), to form a resist underlayer film (thickness 0.05 μm). The refractive index (n value) at a wavelength of 193 nm and the optical absorption coefficient (k value, also referred to as attenuation coefficient) of each resist underlayer film was measured using a spectroscopic ellipsometer. The results are given in Table 1.

TABLE 1

Refractive index n and optical absorption coefficient k

|  |  | n (193 nm) | k (193 nm) |
|---|---|---|---|
| Example 1 | 240° C. baked film | 1.31 | 0.37 |
| Example 2 | 240° C. baked film | 1.33 | 0.38 |
| Example 3 | 240° C. baked film | 1.29 | 0.38 |
| Example 4 | 240° C. baked film | 1.29 | 0.39 |
| Example 5 | 240° C. baked film | 1.36 | 0.36 |
| Example 6 | 240° C. baked film | 1.37 | 0.36 |
| Example 7 | 240° C. baked film | 1.38 | 0.35 |
| Example 8 | 240° C. baked film | 1.39 | 0.35 |
| Example 9 | 240° C. baked film | 1.29 | 0.35 |
| Example 10 | 400° C. baked film | 1.45 | 0.55 |
| Example 11 | 400° C. baked film | 1.44 | 0.43 |
| Example 12 | 400° C. baked film | 1.44 | 0.46 |
| Comparative Example 1 | 240° C. baked film | 1.53 | 0.42 |

(Dissolution Test in Photoresist Solvent)

The resist underlayer film solutions prepared in Examples 1 to 12 and Comparative Example 1 were applied onto silicon wafers using a spin coater. Each applied solution was baked on a hot plate at 240° C. for 1 minute (at 400° C. for 2 minutes in Examples 10 to 12), to form a resist underlayer film (thickness 0.20 μm). Each resist underlayer film was subjected to an immersion test in solvents used in the resist, for instance, ethyl lactate as well as propylene glycol monomethyl ether, propylene glycol monomethyl ether acetate and cyclohexanone.

The films resulting from baking the solutions of Examples 1 to 4 at 240° C. for 1 minute dissolved in these solvents. It was found that the films resulting from baking the solutions of Examples 5 to 9 and Comparative Example 1 at 240° C. for 1 minute, and the films resulting from baking the solutions of Examples 10 to 12 at 400° C. for 2 minutes, were insoluble in these solvents.

(Measurement of the Dry Etching Rate)

An etcher and etching gas used for measuring the dry etching rate were as follows.

RIE-10NR (by Samco): $CF_4$

Each solution of composition for forming a resist underlayer film prepared in Examples 1 to 12 was applied onto a silicon wafer using a spin coater, and was baked on a hot plate at 240° C. for 1 minute (at 400° C. for 2 minutes in Examples 10 to 12), to form a resist underlayer film (thickness 0.20 μm). The dry etching rate was measured using $CF_4$ gas as an etching gas.

The solution of Comparative Example 1 was applied onto a silicon wafer using a spin coater, and was baked on a hot plate at 240° C. for 1 minute, to form a resist underlayer film (thickness 0.20 μm). The dry etching rate was measured using $CF_4$ gas as an etching gas. The dry etching rate was compared with those of the resist underlayer films of Examples 1 to 12. The results are given in Table 2. The rate ratio (1) is the dry etching rate ratio of (resist underlayer film used in the examples)/(resist underlayer film of Comparative Example 1).

TABLE 2

Dry etching rate ratio

| Example 1 | 240° C. baked film rate ratio (1) | 0.76 |
|---|---|---|
| Example 2 | 240° C. baked film rate ratio (1) | 0.76 |
| Example 3 | 240° C. baked film rate ratio (1) | 0.77 |
| Example 4 | 240° C. baked film rate ratio (1) | 0.77 |
| Example 5 | 240° C. baked film rate ratio (1) | 0.86 |
| Example 6 | 240° C. baked film rate ratio (1) | 0.80 |
| Example 7 | 240° C. baked film rate ratio (1) | 0.79 |
| Example 8 | 240° C. baked film rate ratio (1) | 0.86 |
| Example 9 | 240° C. baked film rate ratio (1) | 0.98 |
| Example 10 | 400° C. baked film rate ratio (1) | 0.77 |
| Example 11 | 400° C. baked film rate ratio (1) | 0.79 |
| Example 12 | 400° C. baked film rate ratio (1) | 0.76 |

INDUSTRIAL APPLICABILITY

Thus, the resist underlayer film material of the present invention for use in a lithography process with a multilayer film allows providing a resist underlayer film that has a selection ratio of dry etching close to that of a photoresist, or a selection ratio of dry etching rate smaller than that of photoresist, or a selection ratio of dry etching rate smaller than that of a semiconductor substrate, unlike conventional high etch rate anti-reflective coatings, and that also has the effect of an anti-reflective coating. It was found that the film functions as a hard mask, on the basis of a comparison of the dry etching rate ratio of films baked at 400° C. with that of a phenol novolac resin in a conventional product. Therefore, the film exhibits heat resistance at 400° C. or above.

It was found that the underlayer film material of the present invention has such heat resistance as to enable formation of a hard material on the top layer through vapor deposition.

The invention claimed is:

1. A composition for forming a resist underlayer film, comprising a polymer that contains a unit structure of formula (1) and a unit structure of formula (2) such that proportion of the unit structure of formula (1) to the unit structure of formula (2) is 3 to 97:97 to 3 in molar ratio:

Formula (1)

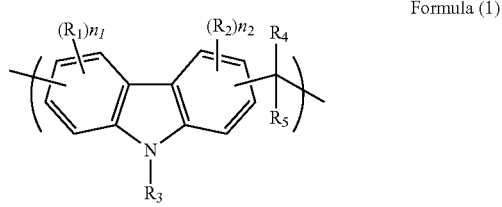

(in formula (1), $R_1$ and $R_2$ are each independently a hydrogen atom, a halogen atom, a nitro group, an amino group, a hydroxy group, a $C_{1-10}$ alkyl group, a $C_{2-10}$ alkenyl group, a $C_{6-40}$ aryl group, or a combination of the foregoing groups optionally including an ether linkage, a ketone linkage, or an ester linkage; $R_3$ is a hydrogen atom, a $C_{1-10}$ alkyl group, a $C_{2-10}$ alkenyl group, a $C_{6-40}$ aryl group, or a combination of the foregoing groups optionally including an ether linkage, a ketone linkage, or an ester linkage; $R_4$ is a hydroYen atom, a $C_{6-40}$ aryl group or heterocyclic group optionally substituted with a halogen atom, a nitro group, an amino group or a hydroxy group; $R_5$ is a $C_{1-10}$ alkyl group, a $C_{6-40}$ aryl group or a heterocyclic group optionally substituted with a halogen atom, a nitro group, an amino group or a hydroxy group; $R_4$ and $R_5$ optionally form a ring with each other; and n1 and n2 are each an integer from 1 to 3);

Formula (2)

(in formula (2), Ar is a $C_{6-20}$ aromatic ring group; $R_6$ is a hydroxy group; $R_7$ is a hydrogen atom, a halogen atom, a nitro group, an amino group, a $C_{1-10}$ alkyl group, a $C_{2-10}$ alkenyl group, a $C_{6-40}$ aryl group, or a combination of the foregoing groups optionally including an ether linkage, a ketone linkage or an ester linkage; $R_8$ is a hydrogen atom, a $C_{6-40}$ aryl group or heterocyclic group optionally substituted with a halogen atom, a nitro group, an amino group or a hydroxy group; $R_9$ is a $C_{1-10}$ alkyl group, a $C_{6-40}$ aryl group or a heterocyclic group optionally substituted with a halogen atom, a nitro group, an amino group or a hydroxy group; $R_8$ and $R_9$ optionally form a ring with each other; n6 is an integer from 1 to p, and n7 is an integer p-n6, where p is the maximum number of substituents with which the aromatic ring group Ar can be substituted).

2. The composition for forming a resist underlayer film according to claim 1, wherein in formula (1), $R_1$, $R_2$, $R_3$, and $R_5$ are hydrogen atoms, and $R_4$ is a naphthalene ring or a pyrene ring.

3. The composition for forming a resist underlayer film according to claim 1, wherein in formula (2), Ar is a naphthalene ring, $R_7$ and $R_9$ are hydrogen atoms, and $R_8$ is a naphthalene ring or pyrene ring.

4. The composition for forming a resist underlayer film according to claim 1, further comprising a cross-linking agent.

5. The composition for forming a resist underlayer film according to claim 1, further comprising an acid and/or an acid generator.

6. A resist underlayer film, obtained by applying the composition for forming a resist underlayer film according to claim 1 onto a semiconductor substrate, and then baking the composition.

7. A method for forming a resist pattern that is used in semiconductor production, the method comprising a step of forming an underlayer film by applying the composition for forming a resist underlayer film according to claim 1 onto a semiconductor substrate, and then baking the composition.

8. A method for producing a semiconductor device, the method comprising the steps of: forming an underlayer film using the composition for forming a resist underlayer film according to claim 1 on a semiconductor substrate; forming a resist film on the underlayer film; forming a patterned resist film by irradiation of light or electron beams and developing; etching the underlayer film according to the patterned resist film; and processing the semiconductor substrate according to the patterned underlayer film.

9. A method for producing a semiconductor device, the method comprising the steps of: forming an underlayer film using the composition for forming a resist underlayer film according to claim 1 on a semiconductor substrate; forming a hard mask on the underlayer film; further forming a resist film on the hard mask; forming a patterned resist film by irradiation of light or electron beams and developing; etching the hard mask according to the patterned resist film; etching the underlayer film according to the patterned hard mask; and processing the semiconductor substrate according to the patterned underlayer film.

10. The method according to claim 9, wherein the hard mask is formed by vapor deposition of an inorganic material.

* * * * *